United States Patent
Tsironis

(10) Patent No.: US 7,053,628 B1
(45) Date of Patent: May 30, 2006

(54) HIGH REFLECTION MICROWAVE TUNER USING METAL-DIELECTRIC PROBE AND METHOD

(76) Inventor: Christos Tsironis, Focus Microwaves - 1603 St. Regis, D. D. O., Quebec (CA) H9B 3H7

( * ) Notice: Subject to any disclaimer, the term of this patent is extended or adjusted under 35 U.S.C. 154(b) by 64 days.

(21) Appl. No.: 10/702,506

(22) Filed: Nov. 7, 2003

(51) Int. Cl.
 *G01R 27/00* (2006.01)
(52) U.S. Cl. ........................... 324/637; 324/638
(58) Field of Classification Search ........ 324/637–645, 324/76.11, 76.51, 71.56; 333/248; 33/35
 See application file for complete search history.

(56) References Cited

U.S. PATENT DOCUMENTS

| | | | |
|---|---|---|---|
| 2,692,971 A * | 10/1954 | Wolf | 324/645 |
| 4,535,307 A | 8/1985 | Tsukii | 33/35 |
| 5,079,507 A | 1/1992 | Ishida et al. | 324/645 |
| 6,297,649 B1 * | 10/2001 | Tsironis | 324/642 |
| 6,515,465 B1 * | 2/2003 | Kiyokawa et al. | 324/76.49 |
| 6,674,293 B1 | 1/2004 | Tsironis | 324/638 |
| 2004/0119481 A1 | 6/2004 | Tsironis | 324/637 |

OTHER PUBLICATIONS

Cusack et al., "Automatic Load Contour Mapping for Microwave Power Transistors", IEEE Transactions on Microwave Theory and Techniques, vol. MTT-22, No. 12, Dec. 1974, p. 1146-1152.

ATN Microwave Inc., "A Load Pull System with Harmonic Tuning", Microwave Journal, Mar. 1996.

Chistos Tsironis, Product Note #41: Computer Controlled Microwave Tuner, CCMT, Focus Microwaves Inc., Jan. 1998.

Christos Tsironis, "System Performs Active Load-Pull Measurements", Microwave & RF, Nov. 1995, pp.102-108.

Michael R. Dehoart Elias Reese Accuracy of Broadband on-Water LP Measurement ARFTG Conference 1994.

* cited by examiner

*Primary Examiner*—Vincent Q. Nguyen

(57) ABSTRACT

Combination metal-dielectric microwave probes are sliding on the central conductor of an electro-mechanical microwave two-probe load pull tuner and create higher reflection factor over a wider frequency bandwidth than was previously possible using pure dielectric probes. The microwave probes are made of a combination of metal and dielectric materials in form of a square metallic slug body with a dielectric cylindrical core embedded inside. The cylindrical dielectric core also guides the probes and allows them to slide smoothly on the central conductor of the tuner airline without major alignment. The probes are positioned horizontally using a remote translation mechanism and allow continuous coverage of the Smith chart over a high frequency and VSWR (reflection factor) range. The mutual horizontal distance between the probes determines the amplitude of the reflection factor, whereas their common distance from the tuner test port determines its phase.

1 Claim, 21 Drawing Sheets

FIG. 1: Prior Art

FIG. 7 Prior Art, Top view

FIG. 8 Partly Prior Art - Cross section

FIG. 9 Prior Art, Cross Section

FIG. 10 Partly Prior Art, Cross Section

FIG. 11 Perspective View

FIG. 12 Perspective View

FIG. 13 Partly Prior Art, Cross Section

FIG. 19 Partly Prior Art

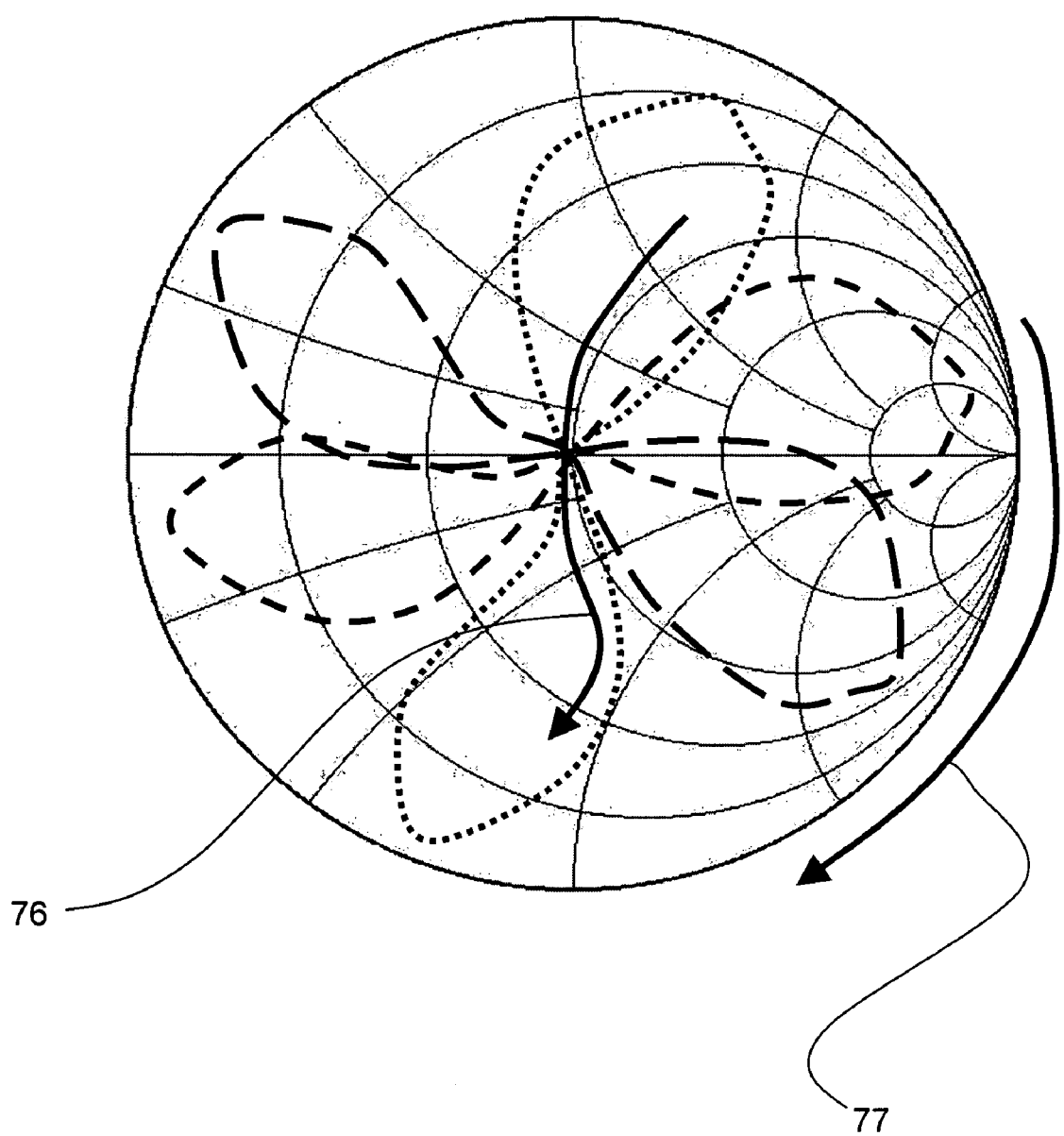
FIG. 21 Partly Prior Art.

HIGH REFLECTION MICROWAVE TUNER USING METAL-DIELECTRIC PROBE AND METHOD

PRIORITY CLAIM

Not Applicable

CROSS-REFERENCE TO RELATED ARTICLES

[1] Cusack et al., "Automatic Load Contour Mapping for Microwave Power Transistors", IEEE Transactions on Microwave Theory and Techniques, Vol. MTT-22, No 12, December 1974, page 1146–1152
[2] Tsironis, U.S. patent application Ser. No. 09/592,983 "Adaptable Prematched tuners and method"
[3] Tsironis, U.S. patent application Ser. No. 10/326,543 "Microwave Tuners for wideband high reflection applications"
[4] Ishida et al., U.S. Pat. No. 5,079,507 "Automatic Microwave Impedance Adjusting Apparatus"
[5] Tsukii, Toshikazu, U.S. Pat. No. 4,535,307 "Microwave circuit device package"
[6] ATN Microwave Inc., "A Load Pull System with Harmonic Tuning", Microwave Journal, March 1996.
[7] Tsironis, C. "Product Note #41: Computer Controlled Microwave Tuner, CCMT", Focus Microwaves Inc., January 1998.
[8] Tsironis, C. "System Performs Active Load-Pull Measurements", Microwaves & RF, November 1995, page 102–108.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to a manual or automatic microwave tuner to be used mainly in wideband automatic load pull testing of power transistors or noise testing of low noise transistors by being able to synthesize the amplitude and phase of selected impedances.

Modern design of high power microwave amplifiers and oscillators, used in various communication systems, requires accurate knowledge of the active device's (microwave transistor's) characteristics. In such circuits, it is necessary for the transistors to operate in their highly non-linear region, close to power saturation, and it is inadequate to be described as such using non-linear analytical or numerical models, in order to design power amplifier circuits.

A popular method for testing and characterizing microwave components (transistors) in the non-linear region of operation is "load pull". Load pull is a measurement technique employing microwave tuners and other microwave test equipment. The microwave tuners are used in order to manipulate the microwave impedance (or reflection factor) conditions under which the Device Under Test (DUT, or transistor) is tested (FIG. 1).

When transistors operate in the non-linear range at high power and close to saturation, signal distortion inside the transistors creates significant harmonic frequency signals that reduce the efficiency and the signal transmission purity of the communication system. In order to improve and optimize the performance of such transistors under these operating conditions, the tuners used to test those high power DUT must provide for very high reflection factors of typically 0.95 to 0.98, corresponding to very low internal impedances of the DUT of the order of 0.5 Ohm or less.

The tuners used in such automatic load pull set-ups must be able to be pre-characterized (calibrated) for different states and at desired frequencies, using a calibrated Vector Network Analyzer (VNA) and to be able to reproduce repeatably the calibrated states.

There are essentially two types of tuners which can be used to allow generation and manipulation of microwave impedances presented to the DUT:

A. Passive electro-mechanical [7] or passive electronic tuners [6], leading to "passive load pull" (FIGS. 1, 2); and;

B. Active tuners, leading to "active load pull" [8].

Electro-mechanical tuners [7] have a number of advantages compared to active tuners [8], such as long-term stability, higher handling of microwave power, much easier operation and lower cost.

Passive electronic tuners [7] have been used in the past, but they provide limited tuning range and handling power and do not offer any significant benefit within the scope of this invention.

DESCRIPTION OF PRIOR ART

Existing passive automatic tuners are typically electro-mechanical, and are used in set-ups shown in FIG. 1.

Typical electromechanical tuners of this kind (7) use the principle of a sliding-screw (FIG. 1), in which adjustable mechanical obstacles (probes, typically metallic) (1) are inserted into the transmission media of the tuners (slotted microwave airlines) (2) and create variable and controllable capacitances (11) as shown in FIG. 3. This reflects part of the power coming out of the DUT and creates a "real" impedance generated at the tuner test port (4) presented to the DUT (FIG. 1).

Probe control is made by means of a horizontal translation mechanism (lead screw) (3) and a vertical control mechanism (vertical axis) (6). By moving the probe up and down (5) we can control the amplitude of the reflection factor and by moving horizontally (8) we can control the phase of the reflection factor presented to the DUT at the tuner's (7) test port (4).

The various electro-mechanical slide-screw tuners differ in the form and function of their RF probes (slugs). FIG. 3 shows the cross section of the tuning area of such a wideband, slide-screw tuner. The metallic RF probe (9) is attached to a (not shown) vertical axis (14) and moves inside a slotted airline or parallel-plate airline (slabline) (10,13) in the middle of which is the center conductor (12). When the probe (9) moves closer to the center conductor (12), a variable, controllable, capacitive load is created in the air-gap (11). This change in capacitance permits to control the amplitude of the microwave reflection factor seen at the test port of the tuner (4) in FIG. 2. When moving the probe parallel to the axis of the airline (2), the phase of the reflection factor is modified and thus any impedance on the Smith Chart (FIG. 5) can be reached. The reflection factor generated by this form of RF probe (slug) is wideband, covering more than 1 octave and typically two to three octaves. Typical reflection factors of 0.8 to 0.9 can be reached using the 'slide-screw' tuners (FIG. 14).

Higher reflection factors, than with single-probe slide screw tuners, can be reached using the 'pre-matching' tuner concept, which includes two independently adjustable probes (15 and 16), in two separate sections of the tuner (22). The sections are separated by a physical vertical wall (23) and the probes are driven by two independent lead screws (18 and 19) and vertical control mechanisms (20 and 21) and are inserted in the same slotted airline (17), as shown in FIG. 4.

In this case (FIG. 5), a prematching reflection factor (vector, 24) is added to the tuning reflection factor (vector, 25) and combined their reflection factors can reach values of up to 0.99 in a certain area of the Smith Chart.

An alternative method for obtaining high reflection factors (or Voltage Standing Wave Ratio, VSWR, which is the equivalent) (FIG. 6) is the concept of using two probes (26, 27), driven by two parallel lead screws (32, 33), with a once adjusted horizontal distance (28) and simultaneous horizontal (29, 30) and vertical (34, 35) control of the distance between the probes and the central conductor of the slotted airline (31) [3]. This type of structure allows generating high reflection factors all over the Smith Chart, and not only in a certain area as the pre-matching tuners, similar to the grey area covered on the Smith Chart in FIG. 16.

An older method that obtains moderate controllable reflection factors automatically is described in 1974 by Cusack et al. [1]. The apparatus described in [1] uses two parallel lead screws (36, 37) in a housing, (FIG. 7, 8). Using horizontal translation mechanisms (41, 42) and electrical servo or stepper motors (43, 44), each of which moves a cylindrical dielectric probe (38, 39 and FIG. 9) along the central conductor of a slotted coaxial airline (86, 87, FIG. 7) {Cusack. [1], page 1146 bottom right}, independently from each-other. The said dielectric probes (45) envelope entirely the central conductor (46) in the coaxial slotted airline structure (47) (FIG. 9). This type of tuner generates, because of the use of purely dielectric probes, moderate reflection factors of the order of 0.8–0.85 and covers a frequency range of about one octave ($f_{max}:f_{min}=2$) (Cusack et al. [1]).

FIG. 8 shows a cross section of the tuning area and the concept of the two horizontal probe tuner of Cusack et al. [1]. Total reflection at the tuner test port (49) is generated by superposition of both reflections (50, 51) of the two dielectric probes (52, 53). Changing the distance (48) between the two probes changes the amplitude of the reflection factor, whereas moving both probes horizontally and simultaneously (54, 55) changes the phase of the reflection factor.

Alternative configurations of the cylindrical dielectric probes used by Cusack et al. [1] are possible (though not yet reported in the literature), as shown in FIG. 10. Here a fully dielectric square slug (56) slides on the center conductor (59) of the slabline (57, 58), leaving a small air gap (60), or no gap at all. The effect of this type of probe is the same as in the case of the cylindrical probe of FIG. 9.

BRIEF SUMMARY OF THE INVENTION

This invention involves a new type of metal-dielectric combination RF probe (slug) used in the type of electromechanical tuner described by Cusack et al. [1]. Whereas Cusack uses RF probes made entirely of dielectric material (FIG. 9) and are of cylindrical form, resembling thick-walled dielectric tubes (FIG. 9), the RF probes proposed here are made of a combination of dielectric material and metal (FIG. 11). The dielectric material is a thin tube (61), which is embedded inside a square metallic block (62). The total is mounted as a single unit and slides on the central conductor (63) of the slotted airline. The probe is moved horizontally attached by a top pin (64) to the horizontal carriage of the tuner (88, 89 in FIG. 8).

Two such RF probes are used in a tuner (FIG. 12) and their position is controlled by stepper motors and associated horizontal displacement mechanisms (FIG. 7).

Compared with the previously used fully dielectric RF probes (FIG. 9 and by extension FIG. 10), this new structure allows much higher reflection factors of up to 0.98 and higher bandwidth, beyond the limit of one octave reported by Cusack et al [1].

Calibrating this tuner in order to reproduce impedances later on in operation is not an obvious task. The tuner has to be characterized by means of two-port S-parameter measurements on a vector network analyzer for a large number of N positions of each of both carriages.

The tuning resolution is a direct result of the number of points N used in the calibration. If a resolution of 5 degrees on a Smith Chart is required then N=360/5=72, for each of both carriages, meaning that the combined number of tuner positions would be 72×72=5,184, for which S-parameters should be measured. Considering data acquisition and associated delays for mechanical movement of the tuners to be set to the corresponding positions, would require several hours for calibrating a tuner at a single frequency, which is unacceptable.

We therefore propose a new calibration method, consisting of positioning the tuner carriages at N+N=2N positions (instead of N×N) and measuring S-parameters over a wide frequency range, including all frequencies of operation of the tuner, then descrambling the data, de-embedding the influence of the tuner housing, and have the tuner fully calibrated at high resolution and over a wide frequency range within one or two hours.

BRIEF DESCRIPTION OF THE SEVERAL VIEWS OF THE DRAWINGS

The invention and its mode of operation will be more clearly understood from the following detailed description when read with the appended drawings in which:

FIG. 21 depicts partly prior art, the tuning mechanism of two-horizontal-probe tuners represented on a Smith Chart.

DETAILED DESCRIPTION OF THE INVENTION

Figure 7:
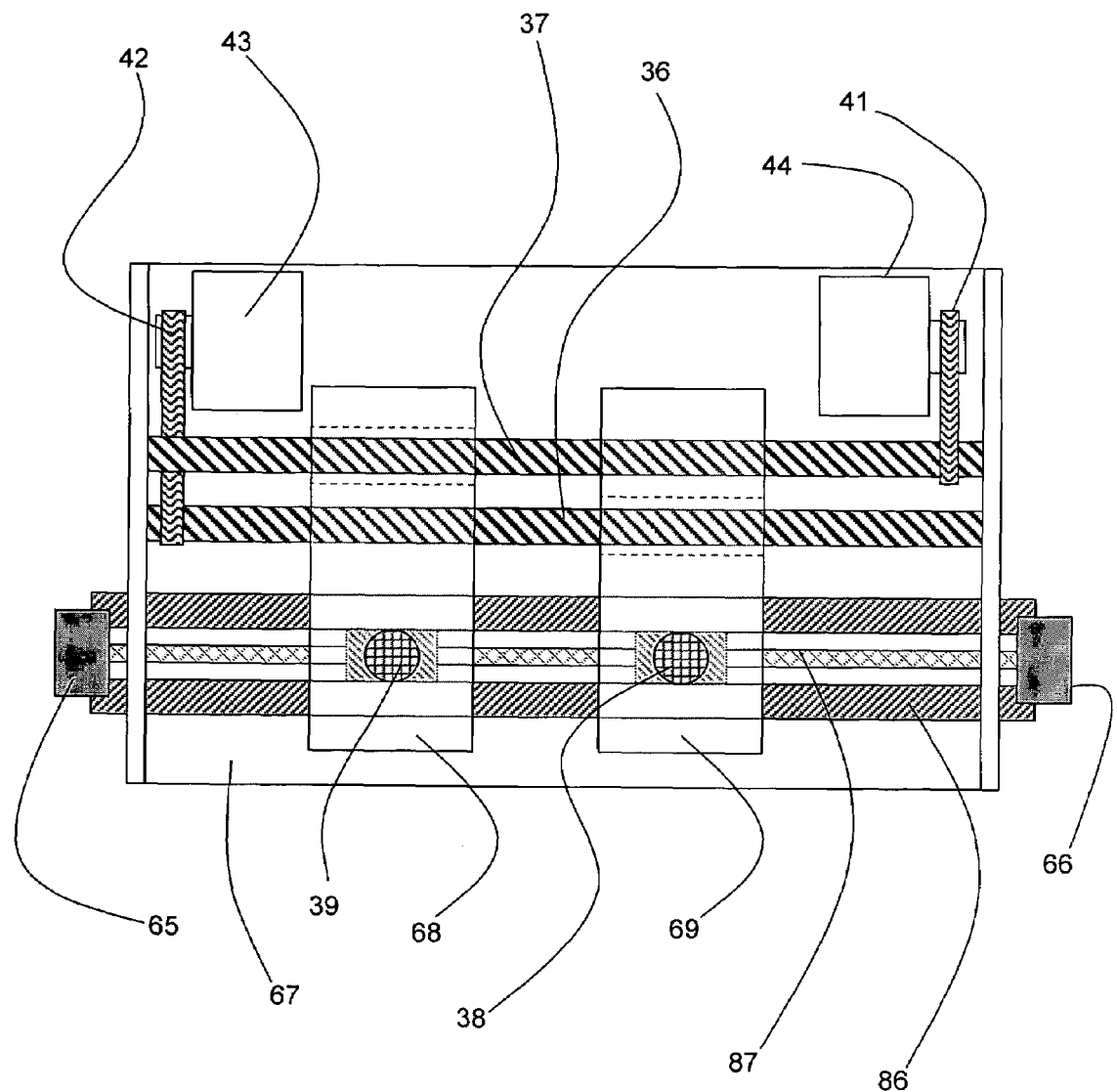
FIG. 7 depicts Prior Art; a top view of an electromechanical tuner using two horizontally movable RF probes.
Figure 8:
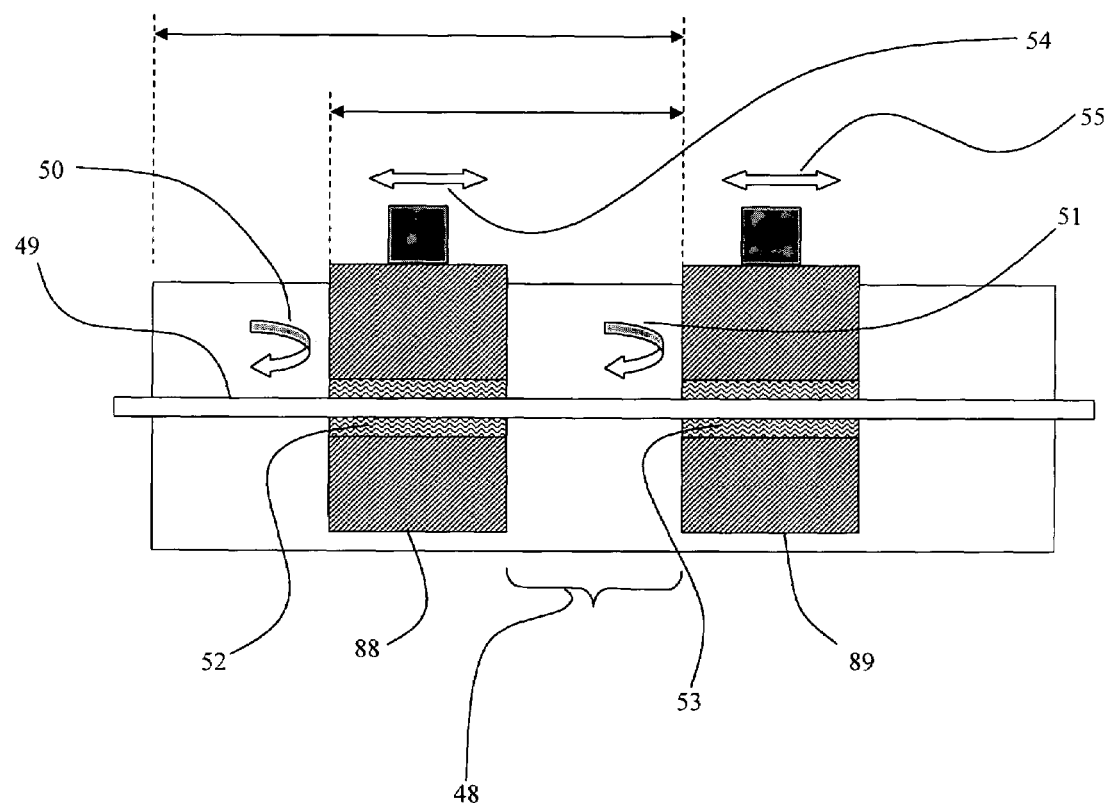
FIG. 8 depicts a cross section of an electromechanical tuner using two horizontally movable metal-dielectric combination RF probes.
Figure 9:
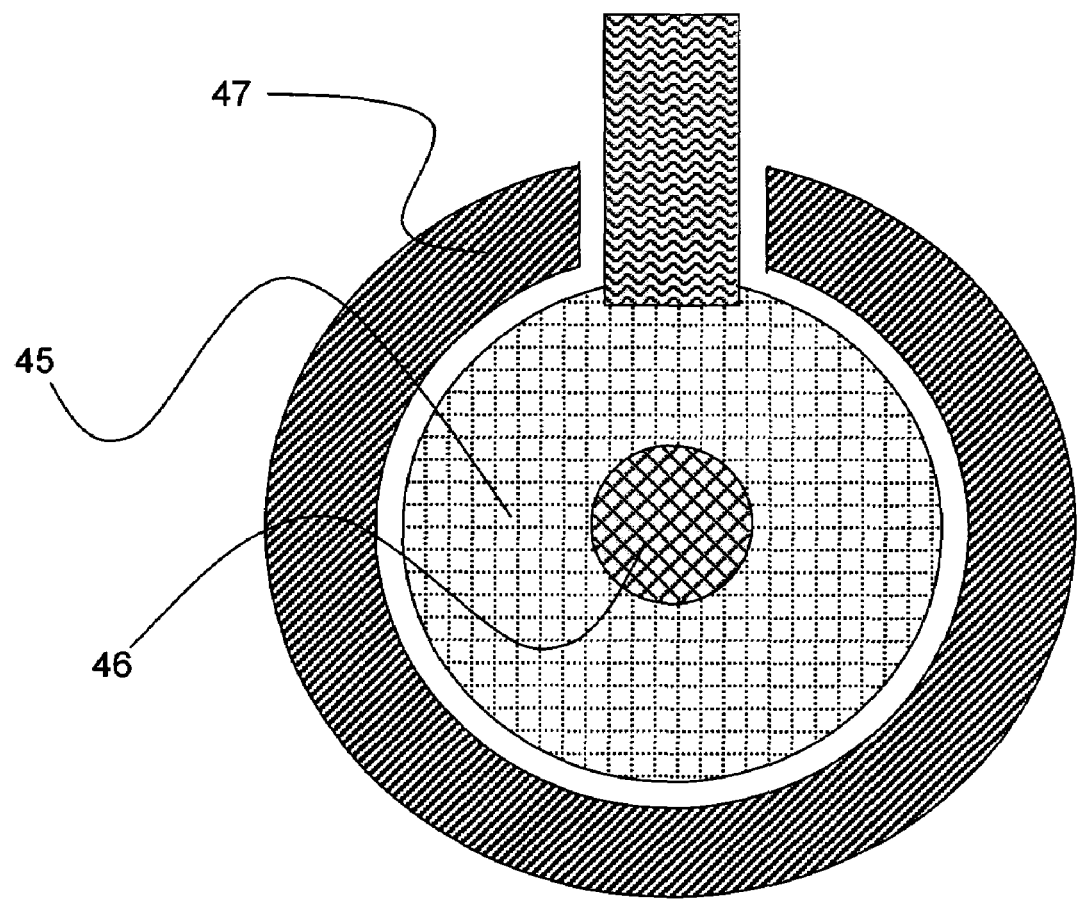
FIG. 9 depicts Prior Art, a cross section of a cylindrical RF probe, movable inside a coaxial airline in the apparatus described by Cusack [1].
Figure 10:
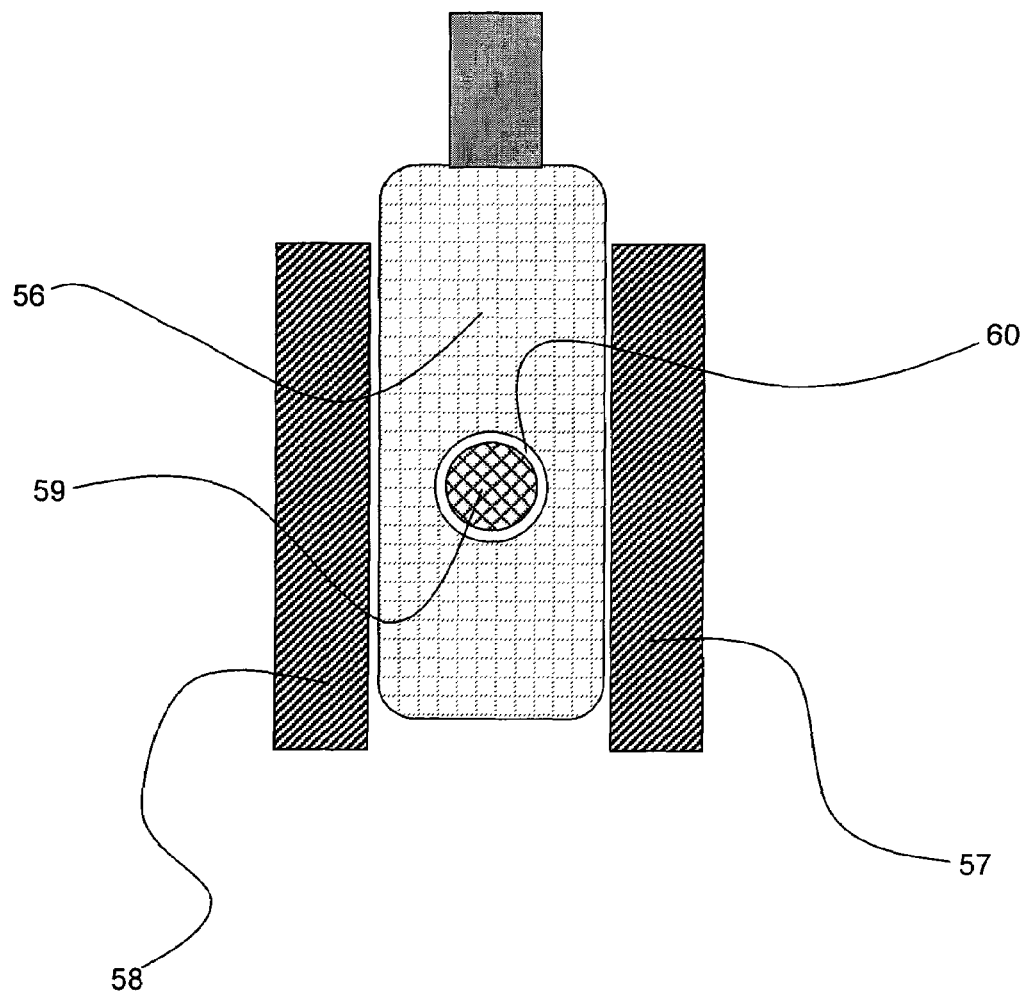
FIG. 10 depicts partly Prior Art, a cross section of rectangular dielectric RF probe, movable inside a parallel plate airline (slabline).

We propose an electro-mechanical microwave load pull tuner as shown schematically in FIGS. 7 and 8, which comprises a slotted transmission airline (40) with an input or test port (65) and output or idle port (66). The airline is mounted inside an enclosure (67), which also holds two translation mechanisms (36, 37), in the form of horizontal lead screws. The horizontal lead screws are driven via timing belts (41,42) by stepper motors (43, 44), which are fixed on the base (67) of the tuner. The lead screws carry mobile carriages (68, 69) that can be moved over the whole length of the tuner body (67).

Figure 12:
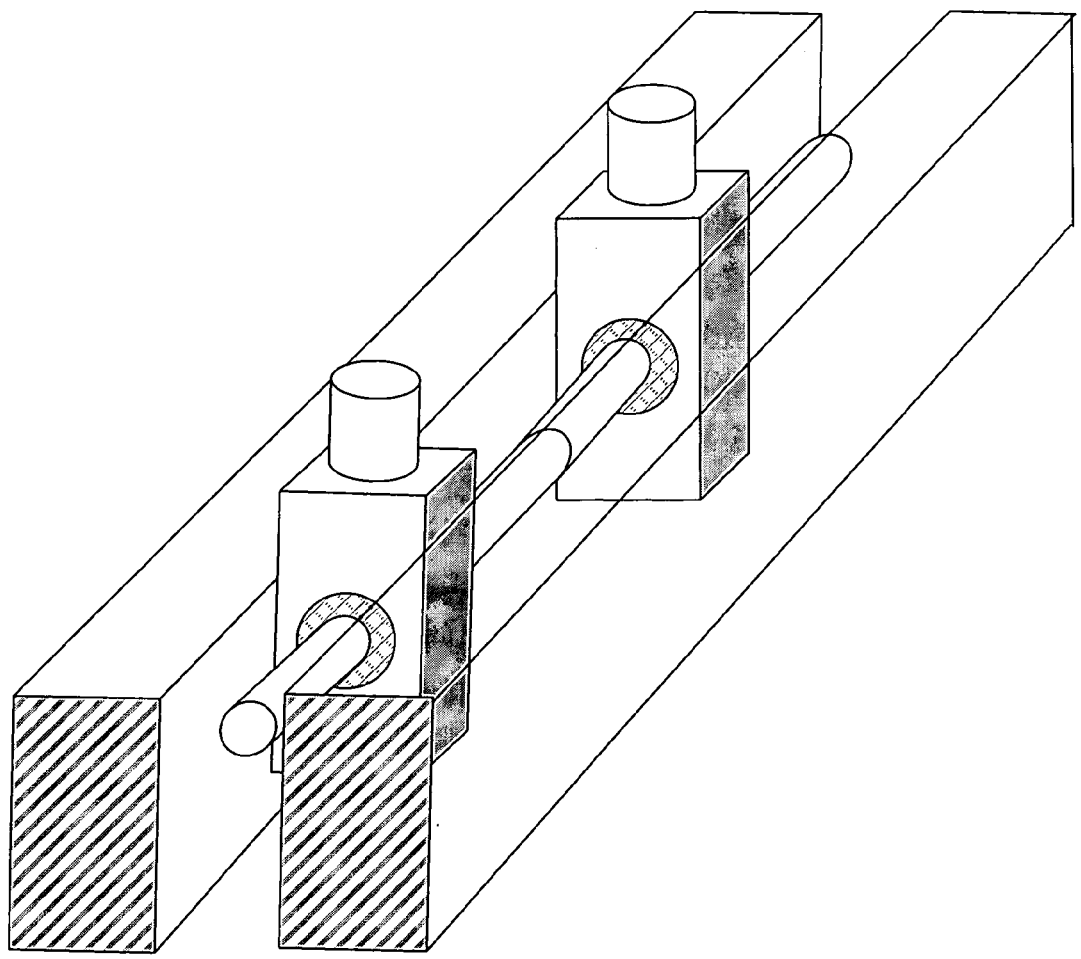
FIG. 12 depicts a perspective view of two new combination RF probes embedded and sliding inside the parallel plate airline (slabline)

The carriages (68, 69) of the tuner shown in FIG. 7, 8 also carry the metal-dielectric combination probes, inserted into and sliding horizontally along the axis of the slotted airline (FIG. 12).

Alternative methods of movement control are known and possible, but shall impede on this invention as being the core of it.

The core of the invention is the nature of the proposed metal-dielectric combination RF probes. It has been established experimentally that, if the probes are made of entirely of dielectric material (as in [1]), then the frequency coverage and the amplitude of the reflection factor generated are low. Typical values of Gamma=0.8 (or VSWR=10:1)(80) are obtained over a frequency span of one octave (Cusack et al. [1]). This is because the probes act mainly as low impedance sections of the transmission airline and each create a moderate reflection factor of approximately 0.6 (78,79)(depending on the dielectric constant of the dielectric material used, such as Teflon with epsilon=2.2); the individual reflections of each probe are combined at the test port of the tuner, generating a moderate total reflection factor (80, FIG. 14). The optimum length of each dielectric probe is one-quarter wavelength at the center frequency of operation and the reflection factor declines thereafter (trajectory (75) in FIG. 19).

Figure 1:
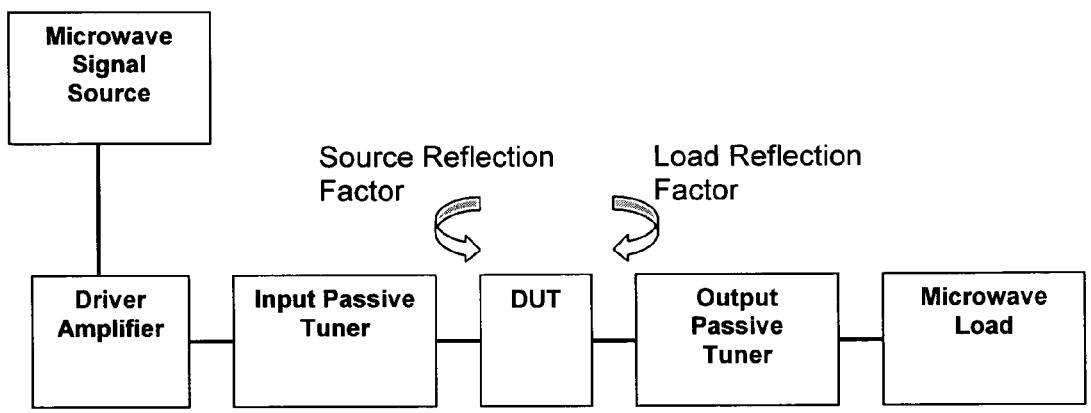
FIG. 1 depicts Prior Art, a load pull test set-up using passive electro-mechanical tuners.
Figure 2:
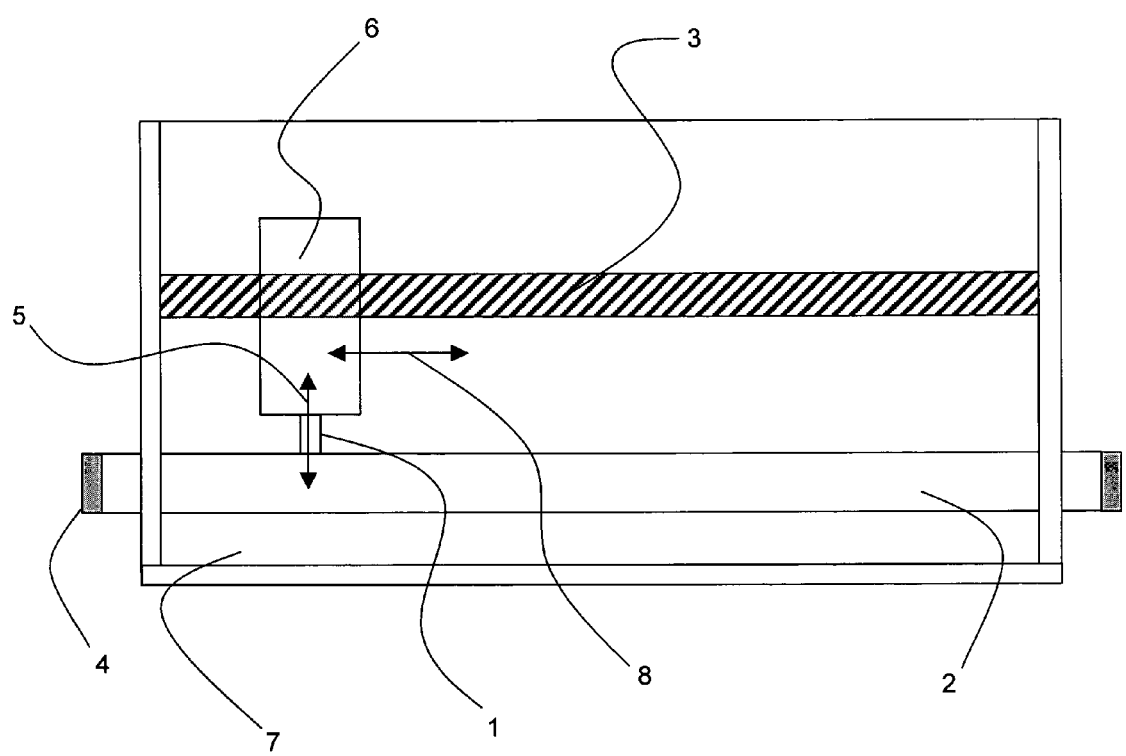
FIG. 2 depicts Prior Art, a front view of an electromechanical slide screw tuner using a single horizontally and vertically controllable RF probe.

Fully metallic probes, as used in typical slide screw tuners (FIG. 3), do not act as impedance transformers, at least not at low and moderate frequencies, up to 12 GHz. They act predominantly as variable capacitances, which provide, by nature, much higher bandwidth. Also, by positioning the metallic probes of slide screw tuners (FIG. 3) very close to the central conductors (air gap (11) being close to zero) large capacitances can be generated resulting in higher reflection factors, of the order of 0.9, than with dielectric-only probes. The disadvantage of the fully metallic probes (9) in slide screw tuners (FIG. 2) is that the probes have to be positioned vertically, very accurately, close to the central conductor and be held at this close distance for horizontal movement over a long section, spanning over one half of a wavelength, in order to cover 360 degrees of phase change of the reflection factor.

Figure 11:
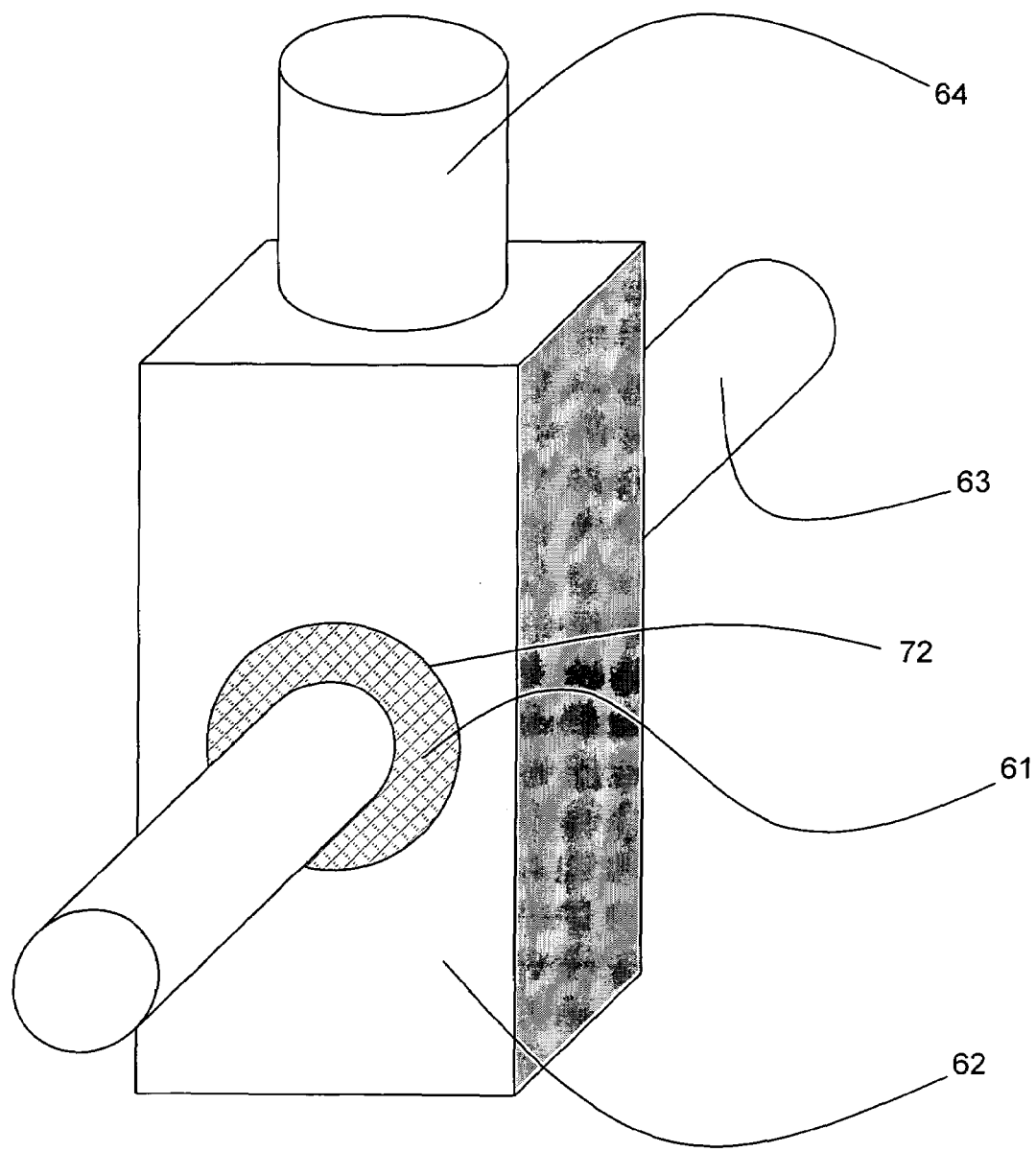
FIG. 11 depicts a perspective view of the new proposed combination RF probe which can slide inside a parallel plate airline (slabline).

The proposed new metal-dielectric combination probes (FIG. 11, 12, 15) include a metallic square block (62), which is as wide as the slot of the slotted airline (70,71) and has a round opening in its center (72), which is filled with dielectric material (61), which slides on the central conductor (63) of the slotted airline (slabline). A holding pin (64) at the top of the metal block connects the probe with the driving mechanism.

Such a probe inserted into a two-horizontally-movable-probe tuner as described by Cusack et al. [1] offers several advantages of full metallic probes, i.e. higher reflection (76, FIG. 16) and larger bandwidth (74, FIG. 19), since the capacitive effect of the metallic component supercedes the impedance transformation effect of the pure dielectric.

This better RF performance of the metal-dielectric combination probes, combined with the fact that these probes are vertically stationary, i.e. their distance from the center conductor of the slotted airline is constant, thus eliminating the need for very precise vertical positioning, makes them a valuable alternative for high reflection factor tuning.

Figure 3:
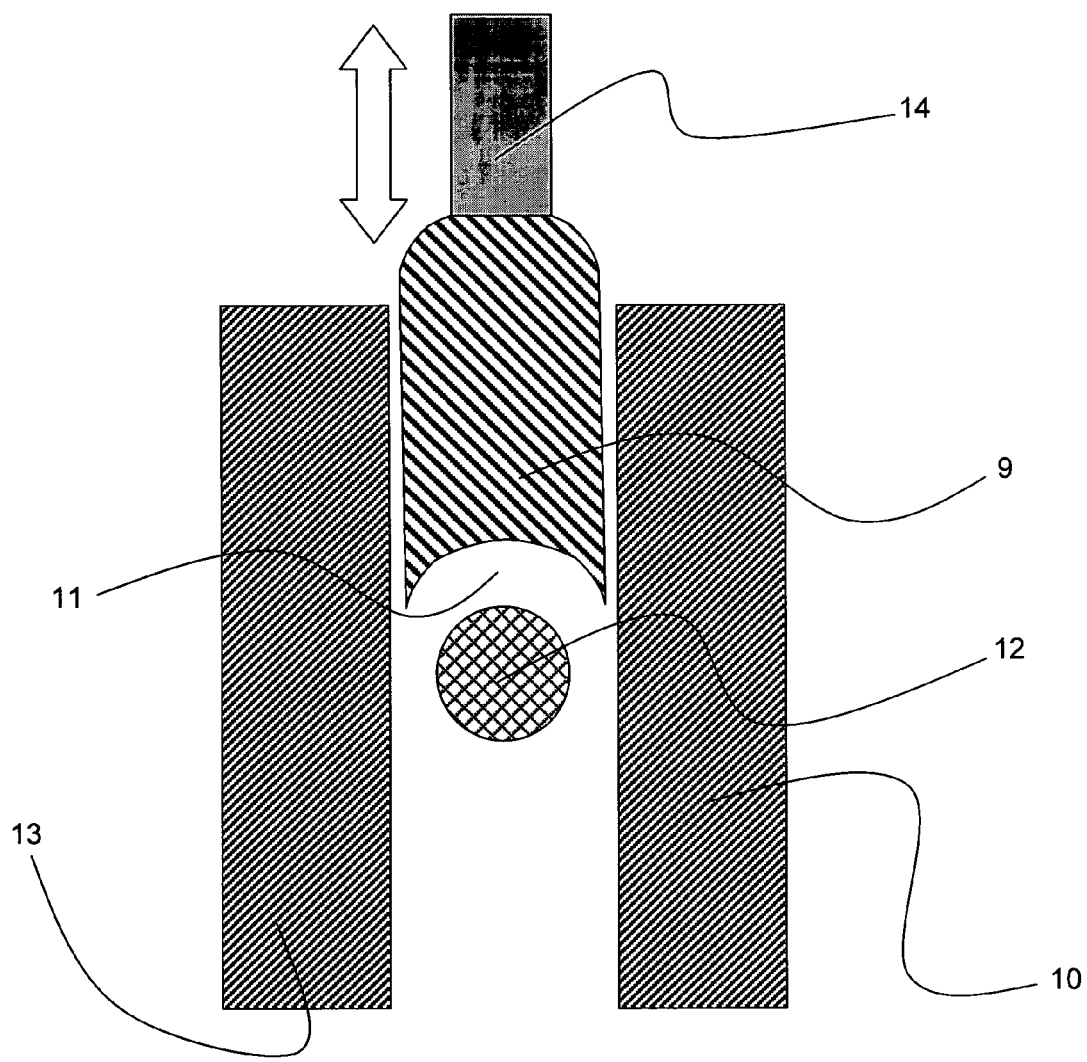
FIG. 3 depicts Prior Art, a cross section of the RF probe of a slide screw tuner inside a parallel plate airline (slabline)
Figure 4:
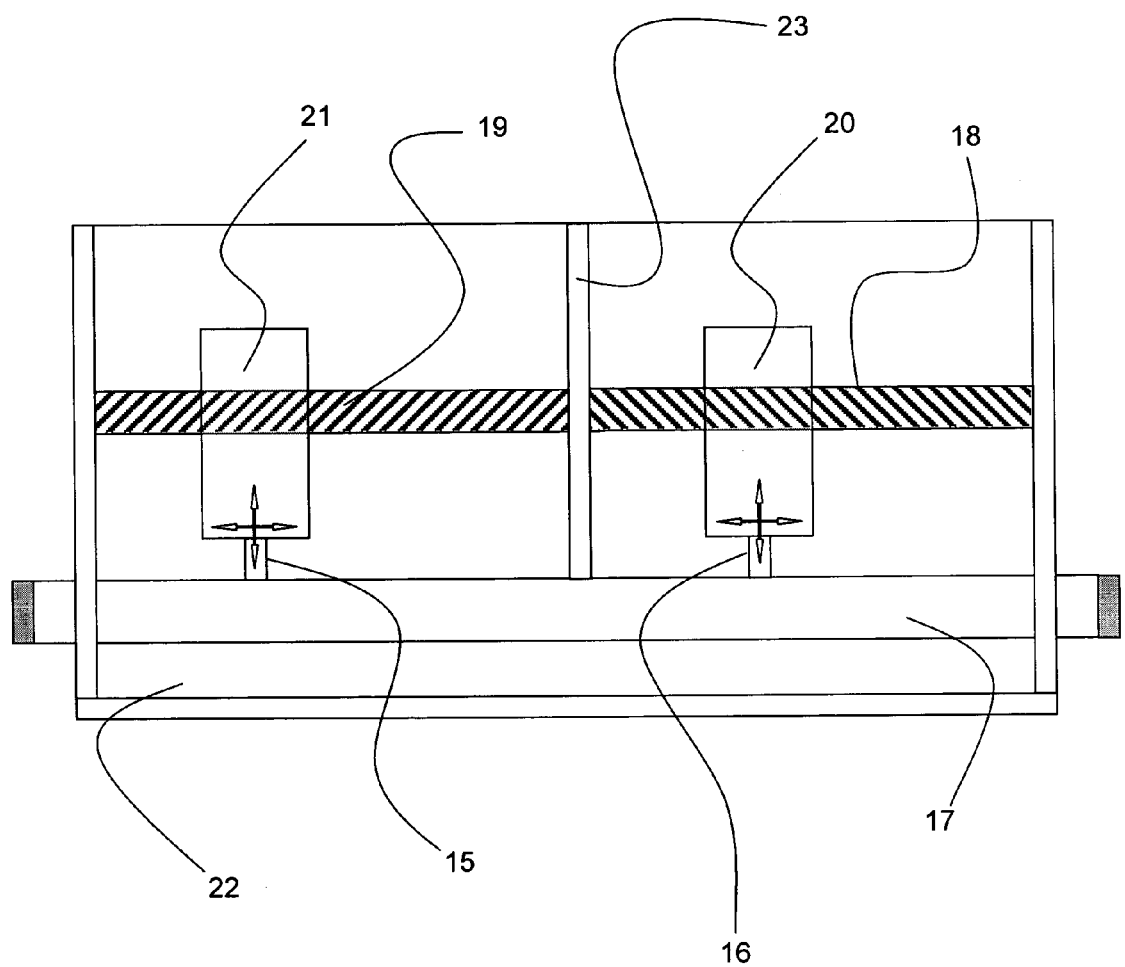
FIG. 4 depicts Prior Art, a front view of an electromechanical pre-matching slide screw tuner, using two independently controllable RF probes.
Figure 5:
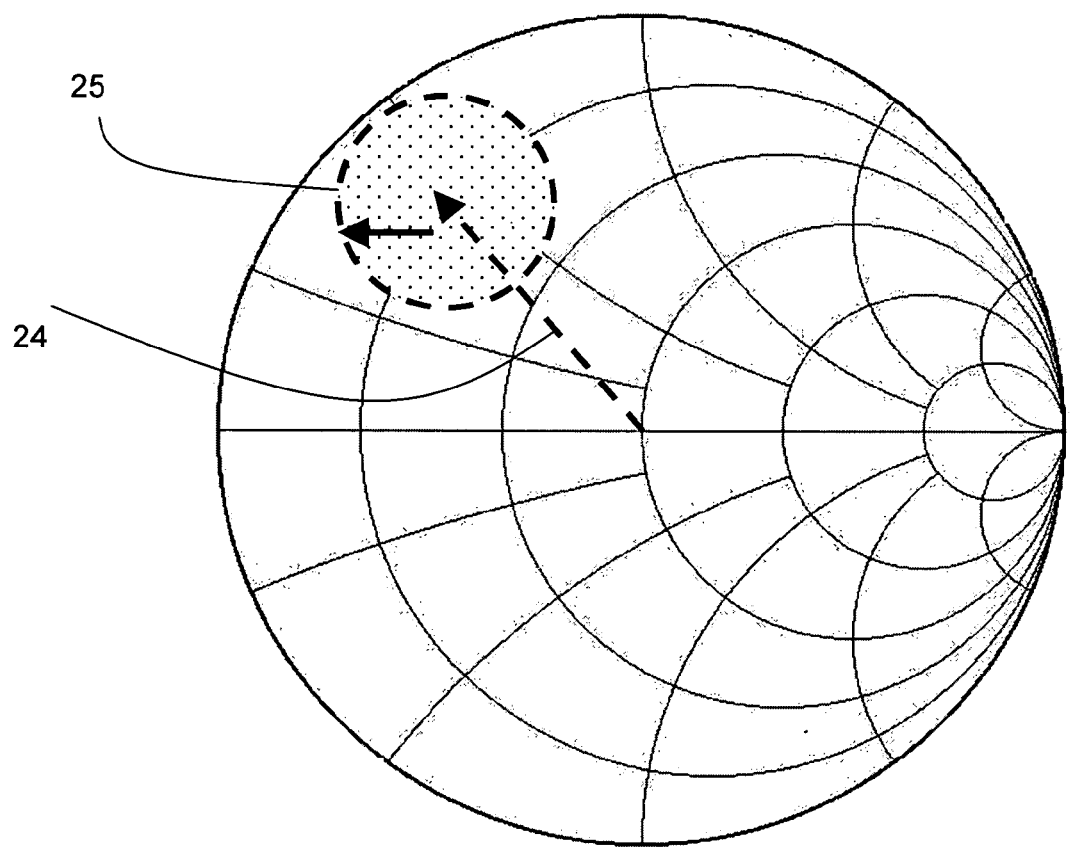
FIG. 5 depicts Prior Art, a presentation of the tuning area of a pre-matching tuner on the reflection factor display (Smith Chart).
Figure 6:
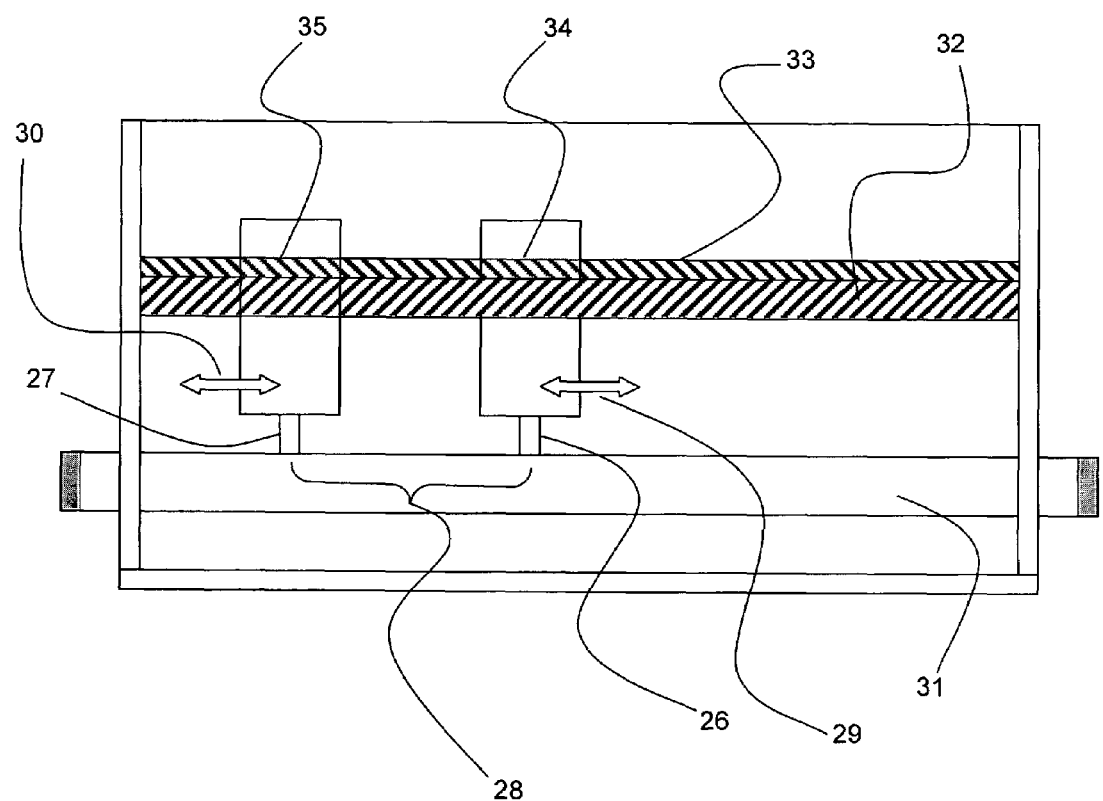
FIG. 6 depicts Prior Art, a front view of an electromechanical slide screw tuner using two RF probes, which move simultaneously horizontally and vertically.
Figure 13:
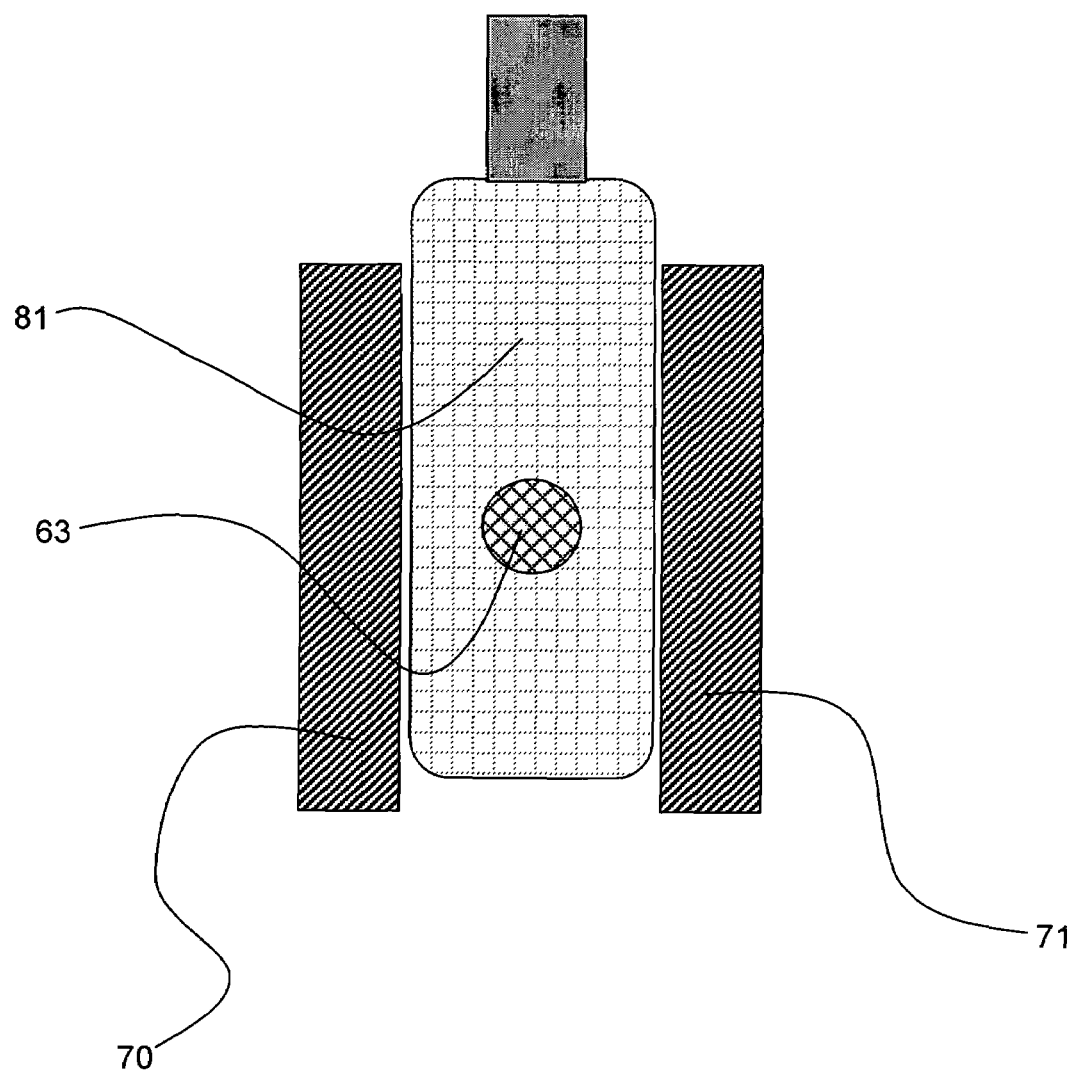
FIG. 13 depicts an extension of Prior Art, a cross section of rectangular dielectric RF probe, movable inside a parallel plate airline (slabline), but without air gap between the dielectric material and the center conductor
Figure 14:
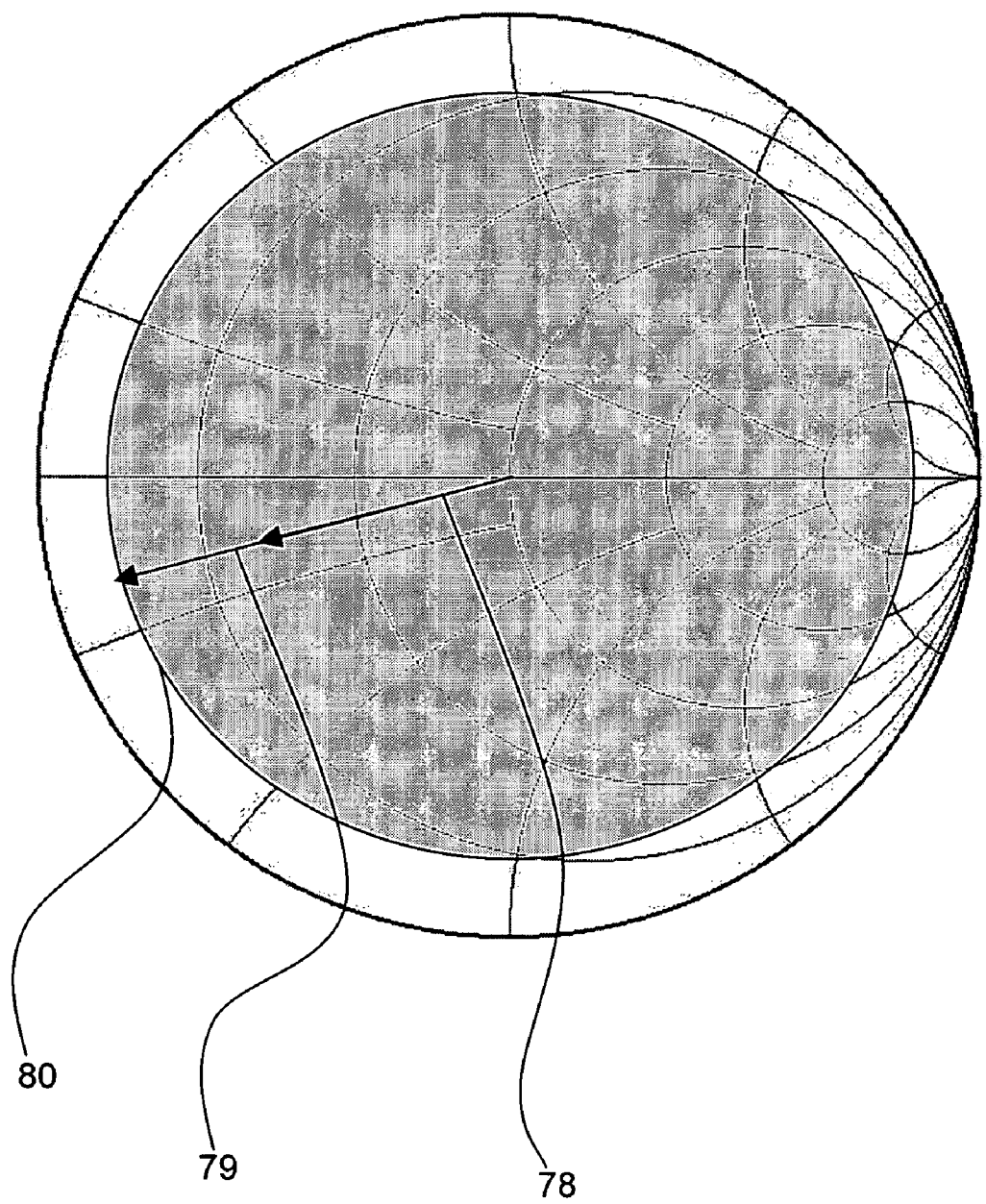
FIG. 14 depicts Prior Art, a presentation of the maximum tuning range of a single probe slide screw tuner or a two Probe tuner by Cusack [1] on the reflection factor display (Smith Chart)
Figure 16:
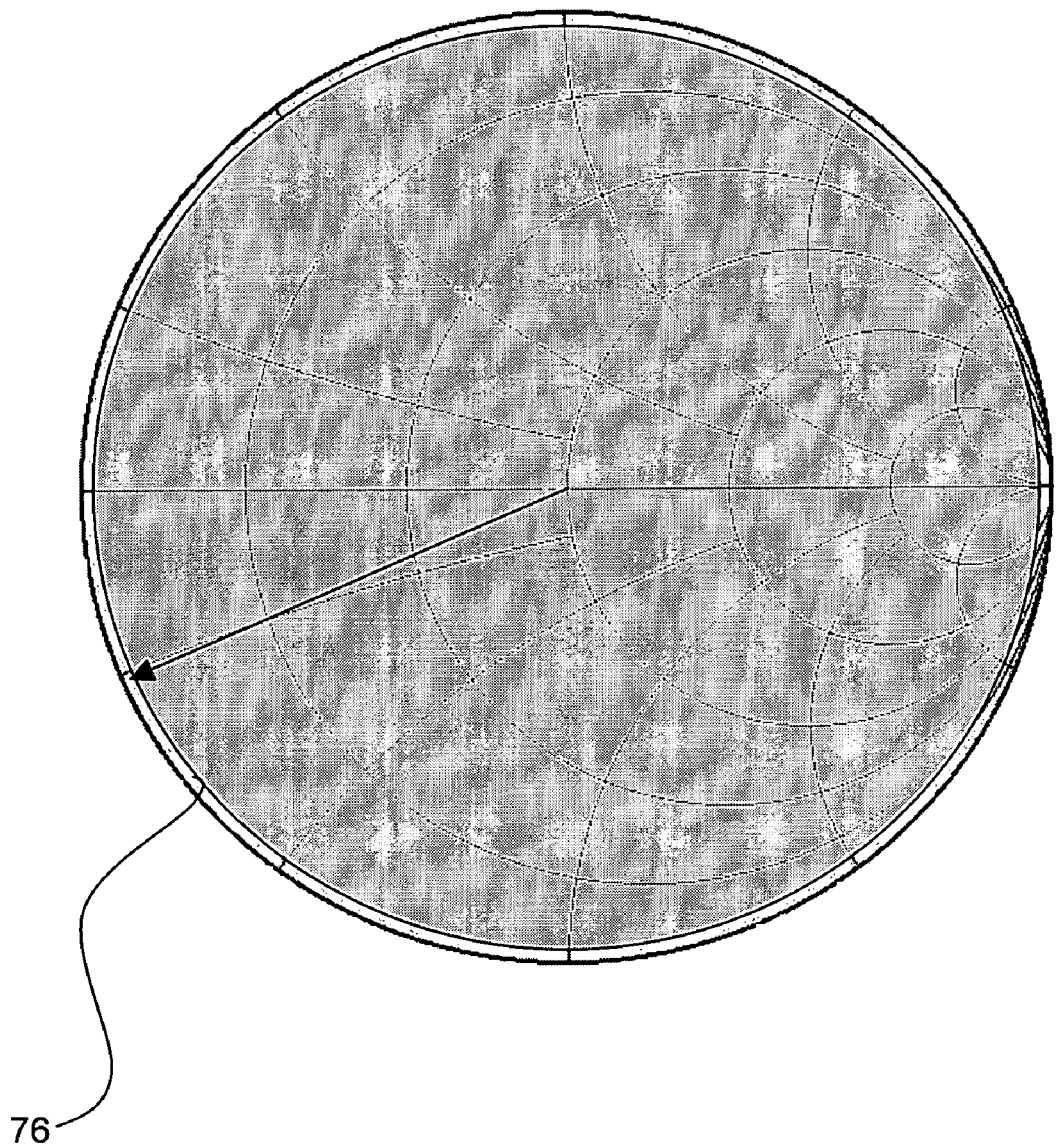
FIG. 16 depicts a presentation of the maximum tuning range of a two probe tuner using metal-dielectric combination RF probes, movable horizontally inside the parallel plate airline (slabline).
Figure 17:
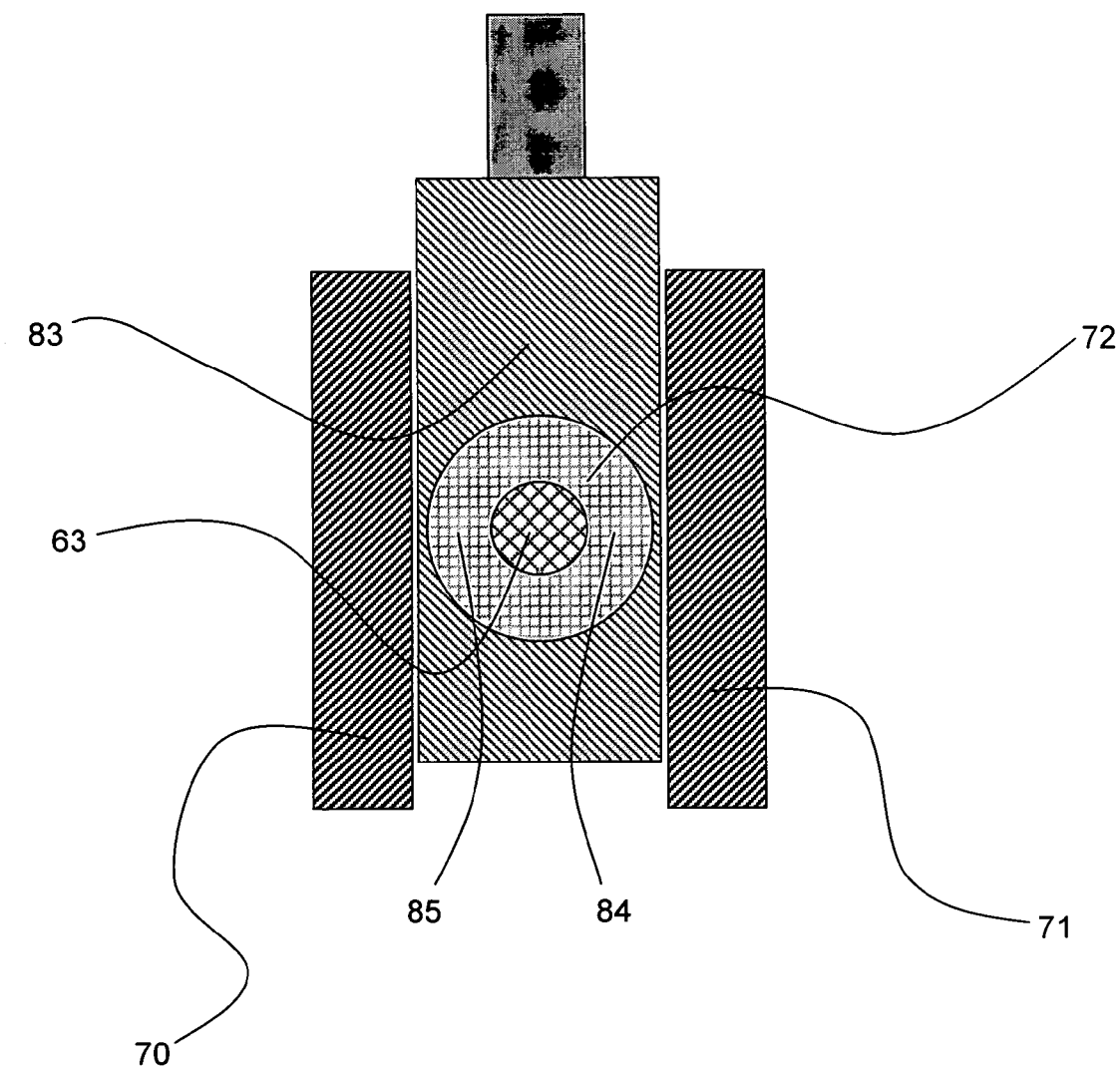
FIG. 17 depicts a cross section of the proposed metal-dielectric RF probe, using a high thickness dielectric ring.
Figure 18:
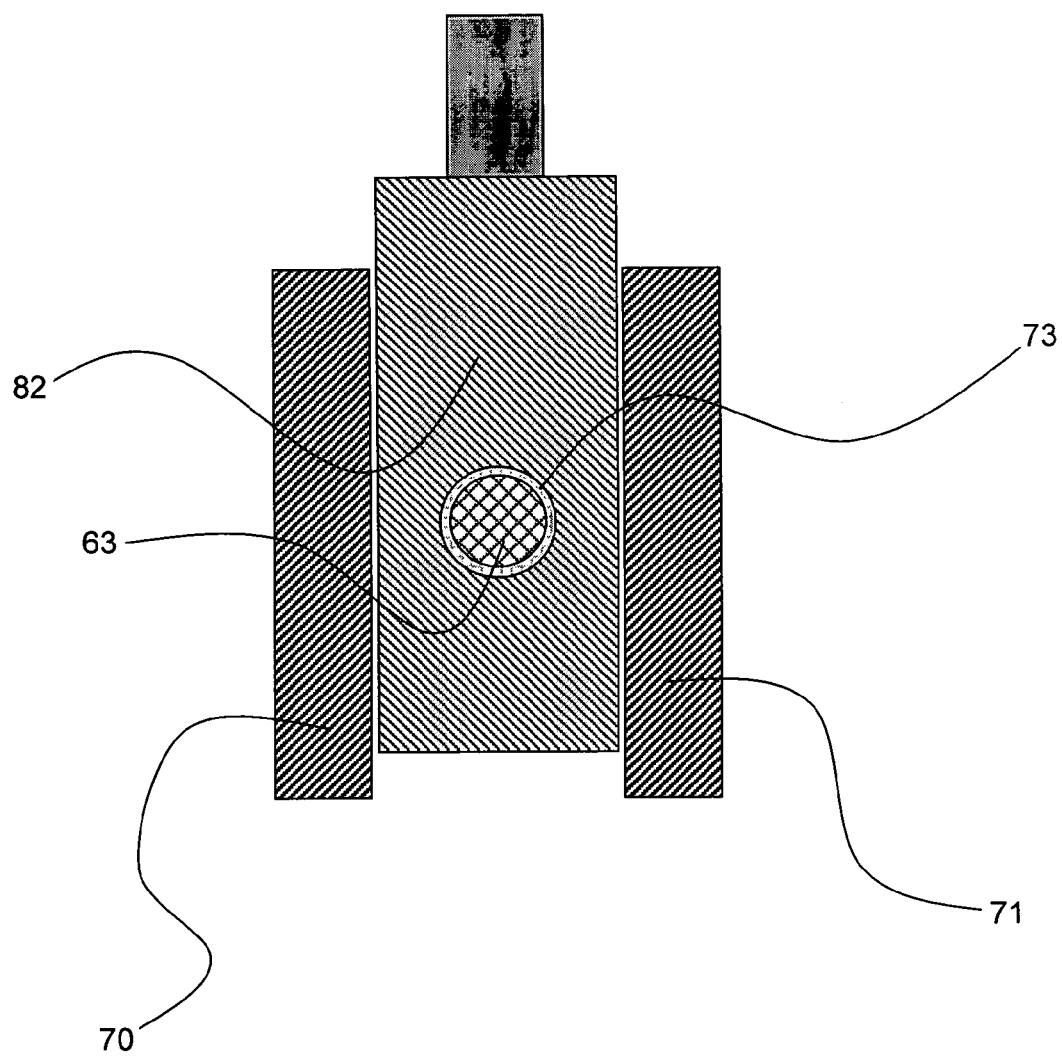
FIG. 18 depicts a cross section of the proposed metal-dielectric RF probe, using an low thickness dielectric ring.
Figure 19:
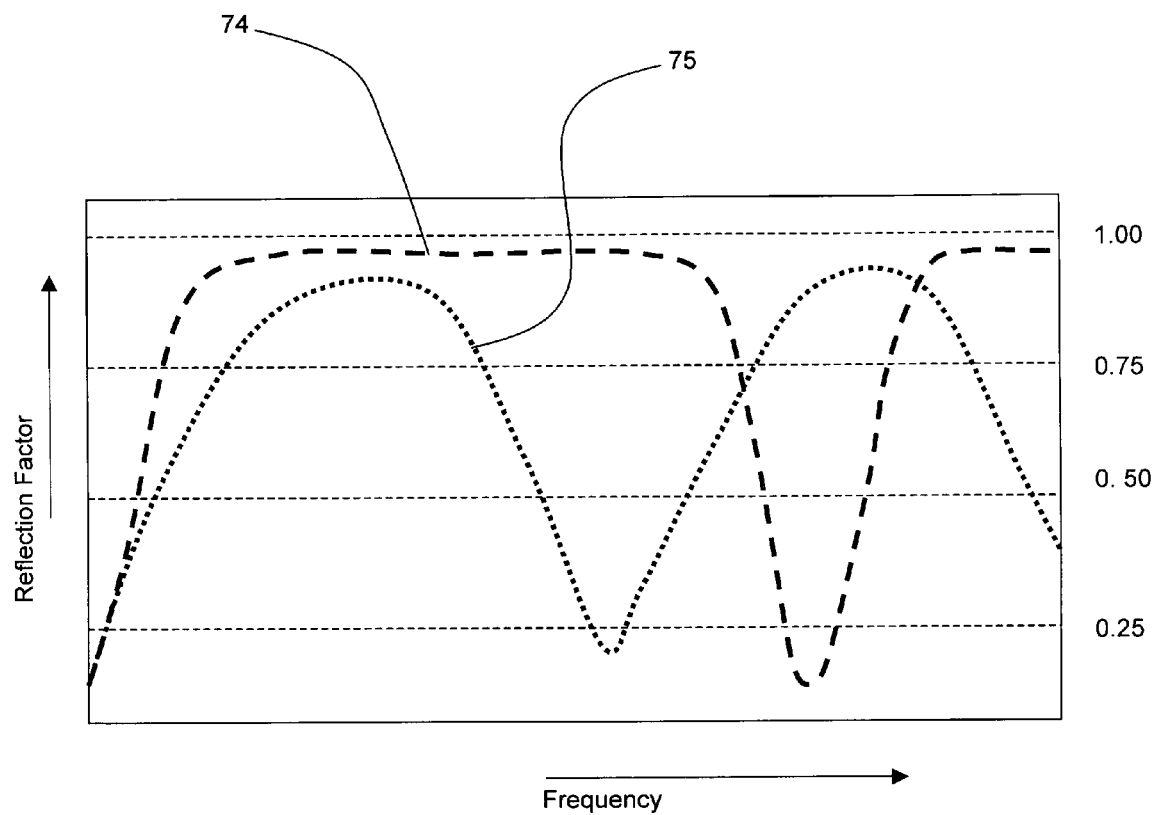
FIG. 19 depicts a comparison of the frequency response of two horizontal probe tuners using either fully dielectric probes (75, prior art) or new metal-dielectric probes (74, this invention).

By changing the thickness of the walls of the dielectric cylinder core of the new metal-dielectric probes (FIG. 13, 15, 17, 18) from a purely dielectric probe (81, FIG. 13) to an almost purely metallic (82, FIG. 18) probe, the basic behavior of the tuners can be varied between the narrow-band-moderate-reflection case of the fully dielectric probes [1], FIG. 14 (80), FIG. 19 (75), and the wideband-high-reflection case of the fully metallic probes of the slide screw tuners, FIG. 3, FIG. 16 (76) and FIG. 19 (74). FIG. 18 shows such a probe with a very thin walled dielectric (73), but it is obvious that the thickness of the core wall cannot be set to zero, without the risk of electrical contact between the center conductor and the metallic probe itself. FIG. 17 shows such a probe with thick walled dielectric core (72), and, again, it is obvious that, increasing farther the thickness of the dielectric material will cut the metallic part (82) in two and we will find ourselves in the case of the fully dielectric probe (FIG. 13), with its limited reflection factor and frequency bandwidth behavior.

Furthermore, it is important to recognize that the thickness of the dielectric material is most important on both lateral sides of the central conductor (84, 85, FIG. 17), because most of the electric field in the transmission airline in concentrated in this region, since it represents the shortest path between the center conductor (63) and the sidewalls (70, 71) of the slabline.

Figure 15:
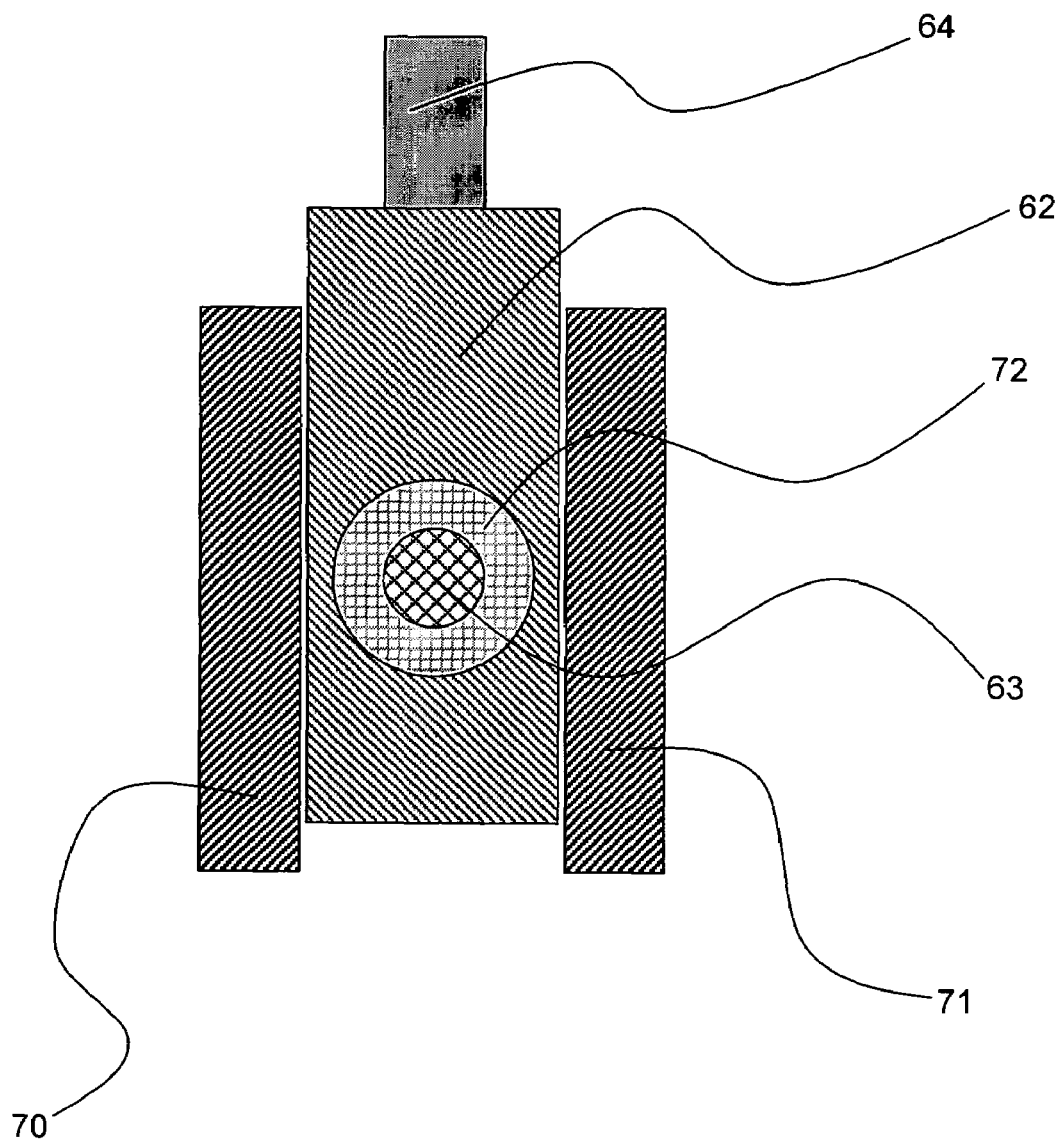
FIG. 15 depicts a cross section of the proposed metal-dielectric RF probe, using a dielectric ring of medium thickness.

When an appropriate thickness of dielectric material is used of roughly ⅓ to ⅔ of the distance between the sidewall of the slabline and the central conductor (FIG. 15), very high reflection factors can be reached, as shown in FIG. 16 (76). Values of up to 0.98 (VSWR~100:1) are easily obtainable over a frequency range of several hundred MHz or several GHz.

The operational frequency range itself of this tuner strongly depends on the length of the probes. The longer the probe the lower the frequency of operation.

The basic behavior of the various types of probes used in this tuner is shown in FIG. 19. Here both extreme cases are depicted: Trace (75) corresponds to the reflection factor behavior of the tuner as a function of frequency for the tuner of Cusack et al. [1] with fully dielectric probes, showing one octave bandwidth and a moderate reflection. Trace (74) corresponds to a tuner using the proposed metal-dielectric combination probes with thin dielectric walls, showing high reflection over a wider frequency range.

The way in which the two individual reflection factors at the two metal-dielectric probes work is demonstrated in FIG. 21. Arrow (76) shows the trajectory of the reflection factor when the distance between the two probes changes, but the virtual center between them remains stationary related to the test port of the tuner. In FIG. 21, each trajectory of the reflection factor follows the same form shaped like the number '8' marked with dotted lines, when the virtual center between the two probes remains stationary compared to the test port of the tuner.

Arrow (77) shows how the trajectories of the reflection factor change when both probes are moved simultaneously, so that the distance between them stays the same, but the distance of their virtual center changes compared to the test port (in this case getting away from the test port).

It is clear that by modifying the positions of both probes any point on the reflection factor plane (Smith Chart), within the amplitude tuning range of the tuner, can be reached (FIG. 16).

Figure 20:
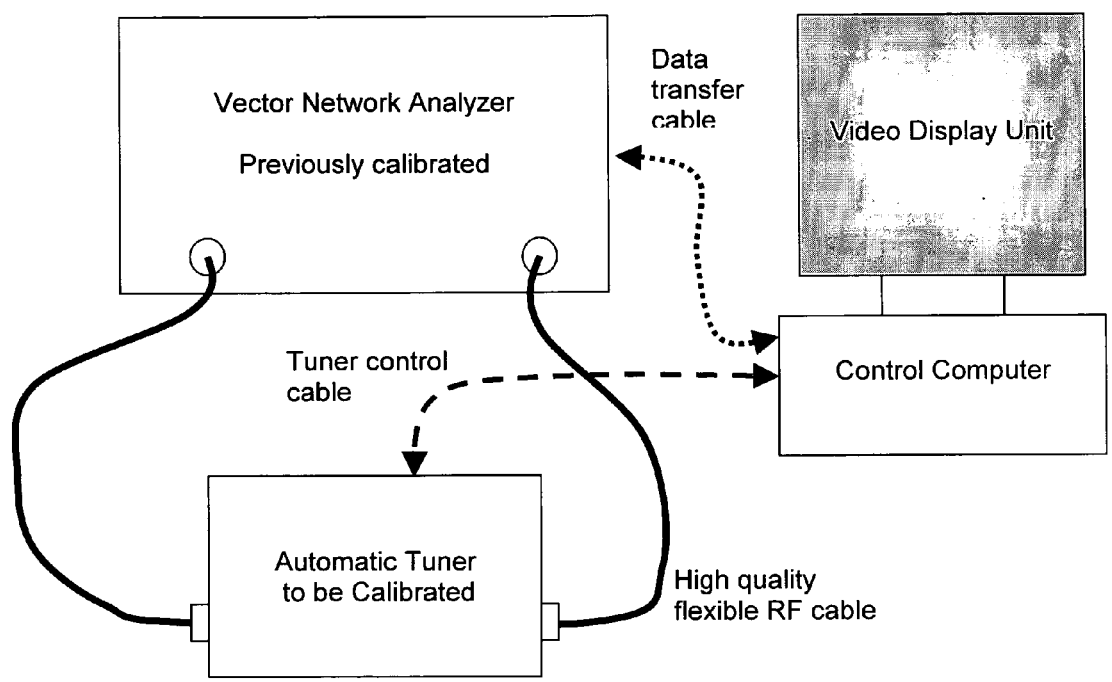
FIG. 20 depicts prior art, a typical set-up used to calibrate electromechanical microwave tuners employing a control computer and a calibrated vector network analyzer.

In order to make the described tuner useful for load pull or noise measurements, it has to be pre-characterized on a calibrated vector network analyzer (VNA) (FIG. 20).

In the set-up of FIG. 20, used to calibrate the tuner, a control computer sends digital control signals to the motor control electronics of the tuner and sets its probes at certain precalculated positions. Once the probes are settled the control computer triggers readings of two-port S-parameters from the calibrated vector network analyzer (VNA). The data read from the VNA is then saved in a data file (calibration file) on the storage media of the control computer (hard-disk).

The calibration of the tuner has to be done for a great number of probe positions, in order to effectively cover the total area of the Smith Chart. For instance, if we want to cover every 5 degrees of phase, then we need at least 72 horizontal positions (360/5=72) for each probe. For the combination of both probes we need then 72×72=5184 positions. Considering the data transfer time and the motor movement time, such a procedure would require several hours. This kind of delay is not acceptable for this type of automatic measurement procedure.

We therefore propose a new calibration technique for this type of tuner. Using the same set-up as in FIG. 20 the following algorithm is used:

Both probes are set to their initial positions, one closest to the tuner test port and one closest to its idle port, at the opposite extreme.

The S-parameters of the tuner two-port are measured for the whole frequency band of operation of the tuner and saved in a data file, named S0.

Then, while probe 2 rests at the far end of the tuner, probe 1 is moved to a number of equidistant steps towards the far end of the tuner (in our example 72 times). Each time the S-parameters are measured for the same frequencies as previously and saved in a data file, named S1. File S1 is, in this case, 72 times larger than file S0.

Then probe 1 is returned to its initial position, closest to the tuner test port and probe 2 is moved in equal steps towards the test port, again in our example 72 times. Each time the S-parameters are measured over the same frequency range and saved in a third data file, named S2. This file has the same size as S1.

Then the data stored in files S0, S1 and S2 are processed in memory of the control computer to generate the final tuner calibration file. This data processing consists of cascading, for each frequency point and each probe 1 position, the S-parameters of file S1 with the inverse S-parameters of file S0 and then cascade the result of this operation, again for each frequency point and each probe 2 position with the S-parameters of file S2.

If the number of frequency points measured is N, the number of probe positions M, then the data points measured are (2×M+1)×N and the data saved in the final tuner calibration file (M×M+1)×N. Since all data manipulations and cascading of the data saved in files S0, S1 and S2 are executed in the computer memory with virtually no time delay, this calibration method is very efficient.

This procedure lasts a reasonably short time, since a total of 72+72+1=145 points (instead of 5184) are measured. The improvement in calibration time increases proportionally to the number of horizontal positions and thus to the selected tuning resolution. At 72 positions the new method is 36 times faster, at 200 positions it is 100 times faster.

I claim:

1. A calibration method for electromechanical tuner of a metal-dielectric combination microwave probes for use in two-probe electromechanical microwave load-pull tuners comprising: a test port and an idle port, wherein said probes are surrounding the central conductor and are sliding over the central conductor of the slotted airline of said tuner and their position is controlled independently by means of a horizontal remote translation mechanism; using a calibrated vector network analyzer (VNA) measuring scattering parameters (S parameters) between the test and idle port of the tuner as a function of the combination of two sets of horizontal positions of the probes related to the test port of the tuner; saving the scattering parameters in a calibration data file for later use; wherein a first set of positions is selected when both probes move simultaneously away from the test port between zero and one half of a wavelength at the center frequency of operation and a second set of positions is selected when the first probe remains immobile closest to the test port and the second probe moves away from zero to one half of a wavelength at the center frequency of operation, relative to the position of the first probe.

\* \* \* \* \*